United States Patent Office 3,113,023
Patented Dec. 3, 1963

3,113,023

PHOTOSENSITIVE LITHOGRAPHIC PLATE COMPRISING PHOTOSENSITIVE DIAZO RESINS AND METHOD FOR PREPARING SAME

Ibert Mellan, Bayside, N.Y., assignor to Polychrome Corporation, Yonkers, N.Y., a corporation of New York No Drawing. Filed July 25, 1961, Ser. No. 126,502
16 Claims. (Cl. 96—33)

This invention relates to a new and improved lithographic printing plate and to a novel method for making such a plate. More particularly it relates to a photosensitive plate which, when exposed to light under a positive transparency and treated with a suitable developing solution will produce a lithographic plate giving a positive print. Such a plate is commonly known as a "positive" plate.

The art of lithographic printing depends upon the immiscibility of grease and water and upon the preferential retention of a greasy image-forming substance by the image areas, and a similar retention of an aqueous dampening fluid by the non-image areas. When a greasy image is imprinted on a suitable surface, and the entire surface is then moistened with an aqueous solution, the grease-attracting or oleophilic image portions retain the ink, whereas the moist, hydrophilic, non-image areas repel it.

The type of lithographic plate to which the present invention is directed, has a coating of a light-sensitive substance which is adherent to a base sheet. The base sheet may comprise any of the materials known for this purpose such as a flexible, waterproof paper, plastic, or thin sheet of metal or laminates thereof. Typical metals would include aluminum, steel, zinc, magnesium, chromium, and copper. If the light-sensitive coating is applied by the manufacturer, the plate is referred to as a "presensitized plate." If the light-sensitive substance is applied by the lithographer, the plate is referred to as a "wipe-on" plate.

Photosensitive plates may be either positive-acting or negative-acting. A negative-acting plate has a light-sensitive coating which becomes hardened and made grease-receptive when struck by light. Such a plate is exposed to light through a negative, and the image portion of the plate becomes hardened and made water-insoluble by the action of the light. The unexposed light-sensitive coating is then removed by a desensitizing solution, leaving a water-receptive or hydrophilic undercoating as the non-image area.

In a positive-acting plate, the reverse is true. The portion of the coating which was not struck by light can be treated with a suitable coupling agent and made water-insoluble and ink-receptive. The non-image area is then washed away with water and makes up the water-receptive or hydrophilic area of the plate.

One of the most useful groups of compounds which are used in making light-sensitive lithographic plates are the diazo resins. The use of these materials on a lithographic plate was suggested as early as 1945 in Kalle French Patent No. 904,255. Since that time, the diazo resins have found particular utility in the manufacture of presensitized metal base lithographics plates which have first been treated with a variety of hydrophilic substances such as the zirconium hexahelide described in Patent No. 2,946,683.

The positive-acting, presensitized plates which are now generally aavilable are coated with a water-insoluble diazo resin. This necessitates the use of solvents to apply the diazo, which will increase the raw materials and manufacturing costs.

The present invention relates to a method by which a typical water-soluble negative-acting light-sensitive diazo resin may be converted to a positive-acting light-sensitive diazo resin. Therefore, in accordance with the present invention, applicant has provided a method for making a new and improved positive-acting planographic printing plate as well as a method for converting a negative-acting plate into a positive plate.

In accordance with the present invention, a planographic printing plate, having been treated with a negative-acting light-sensitive diazo resin, is converted into a positive-acting plate by treating the diazo with a soluble complex cyanide.

More particularly, the treatment is effected with an aqueous solution of a complex cyanide compound containing iron, nickel or cobalt groups, the various soluble ferrocyanides or ferricyanides having been found to be particularly useful for this purpose.

The present invention is applicable to paper base plates such as those described in Patent No. 2,766,688 as well as to various metal base plates. A typical metal base plate to which the present invention may be applied is that shown in U.S. Patent No. 2,946,683.

The plate base may be smooth, etched, or mechanically grained prior to application of the light-sensitive material. It may be provided with a hydrophilic treatment or layer prior to the application of the light-sensitive material as illustrated in the aforesaid patent. It may also be provided with a hydrophilic surface with the image developed.

In accordance with the present invention, a light-sensitive negative-acting water-soluble diazo resin is treated with a solution of the desired cyanide compound, and thereby converted into a positive-acting resin. The resin may be treated either separately or after application to the plate, and in either case, it has been found that a plate can be prepared which will be positive-acting and not require the production of suitable negatives in order to effect the reproduction of images.

The particular cyanide compounds which are referred to in the present invention preferably comprise the ferrocyanides and, in particular, such substances as potassium ferrocyanide, and particularly the alkali metal ferrocyanides such as potassium and sodium ferrocyanides and alkaline earth ferrocyanides such as calcium ferrocyanide.

It should be understood, however, that other soluble ferrocyanides may be utilized which will include ammonium ferrocyanide, lithium ferrocyanide, rubidium ferrocyanide and cesium ferrocyanide. It is also contemplated that the present invention would utilize hydroferrocyanic acid. Various ferricyanides are also within the scope of the present invention, and typical compounds would include sodium and potassium ferricyanides as well as soluble ferricyanides of the metals hereinabove referred to.

While the iron cyanide complexes are to be preferred, it is additionally contemplated that corresponding nickel and cobalt complexes can be substituted where it is economical to do so.

In carrying out the present invention, the negative-acting light-sensitive diazo resin can be any of the typical resins which have found utility in the manufacture of negative-working presensitized lithographic plates. An example of such a diazo resin would be the double salt of zinc chloride and a diazo derivative of p-aminodiphenylamine, condensed and polymerized with formaldehyde. Such a diazo resin prior to its reaction with the contemplated complex cyanide compound is a negative-acting light-sensitive compound. When exposed to ultra-violet light in the form of a thin film, it polymerizes further and becomes infusible, water-insoluble, and ink-receptive.

On the other hand, the positive resin, when exposed to ultra-violet light in a thin film, will not polymerize and become water-insoluble, but will be destroyed. When the surface which has been exposed to light is treated with a suitable coupling agent such as beta-naphthol in a mild alkaline solution, the portion of the surface which was in contact with ultra-violet light is removed. The portion of the surface not in contact with ultra-violet light combines chemically with the coupling agent to form an adhering ink-receptive image. Thus, a suitable printing plate is produced by means of "burning in" an image through exposure of a positive transparency to light, and the resin remaining on the plate is made ink-receptive by means of a coupling agent.

While it is not intended that the invention be bound by any particular theory, it appears that the aqueous solution of the double salt of zinc chloride and the diazo reacts with the cyanide compound to form a novel water-insoluble compound. This reaction product, which is a positive diazo, may then be applied to any of the hydrophilic lithographic surfaces known to the prior art, examples of which are hereinafter referred to. Such surfaces include a paper or plastic surface treated with a suitable starch compound or derivative, and a metallic surface preferably aluminum treated with a soluble silicate, a zirconium hexahalide, or a polyacrylic acid.

The reaction between the cyanide compound and the diazo is preferably performed at room temperature, i.e. 60° F. to 80° F., but elevated temperature up to about 180° F. may also be used. The concentration of the cyanide should be in the range of about 0.25 to 20 percent, and the time of contact may suitably vary from 5 seconds to 3 minutes. It is to be understood, of course, that the particular temperature, concentration, and contact time will vary according to the particular cyanide compound which is employed and which will afford the optimum and most economical operating conditions. Obviously, a higher concentration or contact time can be used within the limits of economy, and the selection of a stronger solution may result in the utilization of a shorter contact or a lower temperature.

To provide more contrast in the plate produced by this method, a small amount of an alkali halide, such as potassium bromide or potassium iodide may be added to the cyanide solution.

A 0.5% aqueous solution of potassium ferrocyanide is applied to the surface of a presensitized mechanically grained aluminum plate which has previously been sensitized with a 4% solution of a negative-acting diazo resin (the condensation product of paraformaldehyde and p-aminodiphenylamine). The potassium ferrocyanide solution is allowed to remain in contact with the surface of the plate for 10 to 30 seconds. The excess solution of potassium ferrocyanide may be removed by washing with water, or draining off, or squeezing off between rollers. If washed off, the excess water is allowed to drain off and the plate is then air dried, fan dried or heat dried. The dry plate is now ready for use. To use this plate, an image is burned into the plate by means of a positive transparency and ultra-violet light. The time of exposure will vary from 5 seconds to 5 minutes, a 45 second exposure, being suitable with the normal arc light and vacuum frame used in lithography.

The plate is now ready to be developed. An aqueous solution of beta-naphthol and tetrasodium pyrophosphate is applied to the plate for 30 seconds and then washed off with water. This solution is made by adding 10 grams of beta-naphthol and 100 to 140 grams of tetrasodium pyrophosphate to 4000 cc. of water. Other mild alkalies may be used in place of tetrasodium pyrophosphate.

Following this treatment, a solution of phenylazoaniline is applied to the plate and allowed to remain there for 30 seconds, then washed off with water. This second solution is prepared by adding 10 grams of phenylazoaniline, 10 grams of naphthalene trisulfonic acid and 10 cc. of concentrated phosphoric acid to 3900 cc. of water. The plate is then wiped off with a desensitizing gum, and a suitable developing lacquer is applied.

In treating the diazotized plate with potassium ferrocyanide, the negative-working diazo has been converted to a positive-working diazo by a reaction between the diazo resin and the ferrocyanide with the formation of a complex consisting of the double salt of zinc chloride and a polymerized diazo derivative of p-aminodiphenylamine and potassium ferrocyanide. This new compound has properties entirely different than the original diazo resin. Thus, when the diazo resin is coated on an aluminum plate or a paper plate and is struck by light through a negative, the portion struck by light is polymerized, becomes insoluble and is imbedded in the plate and is now ink receptive.

This new compound, when applied to an aluminum or paper plate, and struck by light through a positive transparency, is no longer polymerized to an insoluble resin and is not ink receptive. Instead, it can now be removed with water. The portion of the coating which was not struck by light or the image area, can now be coupled with beta-naphthol or other coupling agents. This treatment insolubilizes the new complex and makes it ink-receptive. The non-image area or the area washed away with water is now water receptive.

It should be understood that various methods of treating the plate after exposure can be employed. A typical method of developing is, after exposure, to treat the plate with an aqueous solution of beta-naphthol and tetrasodium pyrophosphate for 30 seconds and then wash with water. Following this treatment, the plate can be developed using lacquers typically employed with diazo-type coated plates. An intermediate treatment with an azo solution can also be used.

The above example can be followed by substituting for potassium ferrocyanide other cyanide derivatives. Specifically, successful plates have been made in accordance with the above procedure using the following solutions: 0.5% potassium ferricyanide, 0.5% sodium ferrocyanide, 0.5% calcium ferrocyanide, 0.75% hydroferrocyanic acid.

These cyanide derivatives may be employed in conjunction with alkali halides such as potassium bromide or potassium iodide. The purpose of this additive is to improve the contrast in the final plate. The halide additive is generally added to the cyanide solution in relatively low concentrations, usually between .01 and 1 percent. Typically the following combination solutions have been used:

(1) 0.5% calcium ferrocyanide and 0.1% KBr
(2) 0.5% potassium ferrocyanide and .01% KBr
(3) 0.25% sodium ferrocyanide and .05% KBr
(4) 0.5% calcium ferrocyanide and 0.1% KI
(5) 0.5% potassium ferrocyanide and 1% KBr The procedure described in the above example can also be followed with a presensitized plate, coated with any of the known hydrophilic layers for such plates or with a paper plate having a suitable hydrophilic coating thereon, such as starch carbamate, polyvinyl alcohol or other coatings known to those skilled in the art.

The coupling agent may consist of an alpha or beta-naphthol solution. A typical composition of a coupling solution would be as follows: 100 grams tetrasodium pyrophosphate, 10 grams of beta-naphthol (finely ground), water to make 4000 cc. This solution is applied to the converted plate and allowed to remain in contact with the plate for a short period of time, typically 30 seconds.

As a further step in developing the plate, a solution of orthophenylphenol may also be applied to the surface of the plate. Such a solution would have the following composition:

(50%)—2000 cc. isopropyl alcohol
(3%)—120 cc. ethylene glycol
(0.1–0.5%)—4 to 20 grams of o-phenylphenol
(0.05–0.1%)—2 to 4 cc. phosphoric acid or oxalic acid
Water to make 4000 cc.

In accordance with the foregoing, the exposure to light is generally from about 45 to 120 seconds, although it should be understood that this would vary in accordance with the particular image which is desired and the intensity of the light. Plates made in accordance with the foregoing technique have been found to produce an excellent image and, when put on a printing press, will readily reproduce 5000 to 25,000 sharp and clear copies.

In the foregoing, the present invention has been described only in connection with preferred embodiments thereof. Many variations and modifications of the principles of the invention within the scope of the description herein are obvious. Accordingly, it is preferred to be bound not by the specific disclosure herein, but only by the appending claims.

What is claimed is:

1. A positive-acting light-sensitive planographic printing plate comprising a flexible base and a light-sensitive diazo coating on said base, said diazo coating being the reaction product of a light-sensitive water-soluble diazo resin and a water-soluble cyanide from the group consisting of iron, cobalt and nickel complex cyanides.

2. A positive-acting light-sensitive planographic printing plate comprising a flexible base and a light-sensitive diazo coating on said base, said diazo coating being the reaction product of a light-sensitive water-soluble diazo resin and a water-soluble ferrocyanide.

3. A positive-acting light-sensitive planographic printing plate comprising a flexible base and a light-sensitive diazo coating on said base, said diazo coating being the reaction product of a light-sensitive water-soluble diazo resin and potassium ferrocyanide.

4. A positive-acting light-sensitive planographic printing plate comprising a metallic base, a hydrophilic coating on said base, and a light-sensitive diazo coating overlying the hydrophilic coating, said diazo coating being the reaction product of a light-sensitive water-soluble diazo resin and a soluble ferrocyanide.

5. A positive-acting light-sensitive planographic printing plate comprising an aluminum base, a hydrophilic coating on said base, and a light-sensitive diazo coating overlying the hydrophilic coating, said diazo coating being the reaction product of a light-sensitive water-soluble diazo resin and potassium ferrocyanide.

6. A positive-acting light-sensitive planographic printing plate comprising an aluminum base, a hydrophilic coating thereon provided by treating said base with an aqueous solution of a zirconium hexahalide, and a light-sensitive diazo coating overlying the hydrophilic coating, said diazo coating being the reaction product of the condensation product of paraformaldehyde and p-aminodiphenylamine with potassium ferrocyanide.

7. The method of making a positive-acting light-sensitive planographic printing plate from a negative-acting plate coated with a light-sensitive water-soluble diazo resin comprising treating said plate with a solution containing from about 0.25 percent to 20 percent of a cyanide compound from the group consisting of iron, cobalt and nickel complex cyanides.

8. The method of making a positive-acting light-sensitive planographic printing plate from a negative-acting plate coated with a light-sensitive water-soluble diazo resin comprising treating said plate with an aqueous solution containing from about 0.25 percent to 20 percent of a ferrocyanide.

9. The method of making a positive-acting light-sensitive planographic printing plate from a negative-acting plate coated with a light-sensitive water-soluble diazo resin comprising treating said plate with an aqueous solution containing from about 0.25 percent to 20 percent potassium ferrocyanide.

10. The method of making a positive-acting light-sensitive metal base planographic printing plate from a negative-acting plate coated with a light-sensitive water-soluble diazo resin comprising treating said plate with an aqueous solution containing from about 0.25 percent to 20 percent of an alkali ferrocyanide.

11. The method of making a positive-acting light-sensitive aluminum planographic printing plate from a negative-acting plate coated with a light-sensitive water-soluble diazo resin comprising treating said plate with an aqueous solution containing from about 0.25 percent to 20 percent of an alkali ferrocyanide.

12. The method of making a positive-acting light-sensitive aluminum planographic printing plate from a negative-acting plate coated with a light-sensitive water-soluble diazo resin comprising treating said plate for from about 5 seconds to 3 minutes with an aqueous solution containing from about 0.25 percent to 20 percent potassium ferrocyanide.

13. The method for converting a light-sensitive negative-acting water-soluble diazo resin into a positive-acting diazo resin which comprises reacting said diazo with an aqueous solution of a soluble ferrocyanide for from about 5 seconds to 3 minutes at a temperature from ambient temperature to about 180° F.

14. The method of making a positive-acting light-sensitive planographic printing plate from a negative-acting plate coated with a light-sensitive water-soluble diazo resin comprising treating said plate with a solution of a cyanide compound from the group consisting of iron, cobalt and nickel complex cyanides, exposing the resulting treated plate to actinic light to decompose the diazo resin in the exposed areas of the plate and treating the non-exposed areas of the plate with a mild alkaline solution comprising a coupling agent for said diazo resin to produce an adhering ink-receptive positive image thereon.

15. The method of making a positive-acting light-sensitive planographic printing plate from a negative-acting plate coated with a light-sensitive water-soluble diazo resin comprising treating said plate with a solution containing from about 0.25% to 20% of a water-soluble ferrocyanide, exposing the resulting treated plate to actinic light to decompose the diazo resin in the exposed areas of the plate and treating the non-exposed areas of the plate with a mild alkaline solution comprising a coupling agent for said diazo resin to produce an adhering ink-receptive positive image thereon.

16. The method of making a positive-acting light-sensitive planographic printing plate from a negative-acting plate coated with a light-sensitive diazo resin comprising the condensation product of paraformaldehyde and p-aminodiphenylamine comprising treating said plate with a solution containing from about 0.25% to 20% potassium ferrocyanide, exposing the resulting treated plate to actinic light to decompose the light-sensitive diazo resin in the exposed areas of the plate and treating the non-exposed areas thereof with a mild alkaline solution comprising a coupling agent for said diazo resin to produce an adhering ink-receptive positive image thereon.

(References on following page)

References Cited in the file of this patent

UNITED STATES PATENTS 2,063,631 Schmidt et al. ............ Dec. 8, 1936
2,291,130 Alink .................... July 28, 1942
2,593,911 Neumann et al. ........... Apr. 22, 1952
2,702,242 Neugebauer et al. ......... Feb. 15, 1955
2,714,066 Jewett et al. ............ July 26, 1955
2,946,683 Mellan et al. ............ July 26, 1960

OTHER REFERENCES

Neugebauer (German Auslegeschrift), 1,059,766, June 18, 1959.